(12) United States Patent
Sato

(10) Patent No.: US 9,806,139 B2
(45) Date of Patent: Oct. 31, 2017

(54) LIGHT EMITTING ELEMENT DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/602,909

(22) Filed: Jan. 22, 2015

(65) Prior Publication Data

US 2015/0214285 A1    Jul. 30, 2015

(30) Foreign Application Priority Data

Jan. 27, 2014   (JP) ................................ 2014-012823

(51) Int. Cl.
  *H01L 27/32*   (2006.01)
(52) U.S. Cl.
  CPC ...... *H01L 27/3265* (2013.01); *H01L 27/3262* (2013.01)
(58) Field of Classification Search
  CPC .................................................. H01L 27/3265
  See application file for complete search history.

(56) References Cited

U.S. PATENT DOCUMENTS

| | | | | |
|---|---|---|---|---|
| 7,507,998 | B2* | 3/2009 | Tseng | ............................... 257/72 |
| 2002/0140343 | A1 | 10/2002 | Hirabayashi | |
| 2008/0079005 | A1 | 4/2008 | Tseng | |
| 2010/0182223 | A1* | 7/2010 | Choi | ..................... G09G 3/3233 345/76 |
| 2011/0115839 | A1 | 5/2011 | Takahashi et al. | |
| 2013/0044095 | A1* | 2/2013 | Heo et al. | ...................... 345/211 |
| 2014/0061606 | A1* | 3/2014 | Kim et al. | ....................... 257/40 |
| 2014/0077180 | A1 | 3/2014 | Moon | |
| 2014/0077184 | A1* | 3/2014 | Im et al. | .......................... 257/40 |
| 2014/0131666 | A1* | 5/2014 | Song et al. | ..................... 257/40 |
| 2015/0055051 | A1 | 2/2015 | Osawa et al. | |

FOREIGN PATENT DOCUMENTS

JP    2002-352955 A    12/2002

OTHER PUBLICATIONS

Shinya Ono, Koichi Miwa, Yuichi Maekawa, and Takatoshi Tsujimura, "VT compensation circuit for AM OLED displays composed of two TFTs and one capacitor," IEEE Trans. Elect. Devices, vol. 54, No. 3, Mar. 2007, p. 462-467.*

The U.S. Office Action dated Jun. 7, 2017 for corresponding U.S. Appl. No. 14/950,897 which is a continuation in part of this application.

* cited by examiner

*Primary Examiner* — Su C Kim
*Assistant Examiner* — David S Wilbert
(74) *Attorney, Agent, or Firm* — Typha IP LLC

(57) ABSTRACT

A light emitting element display device includes light emitting elements that emit light by allowing a current to flow in a plurality of pixels arranged in a display area in a matrix, and at least two transistors that are arranged in each of the plurality of pixels, and control the current flowing in the light emitting elements, in which semiconductor portions of the at least two transistors are formed in layers different from each other.

3 Claims, 12 Drawing Sheets

LIGHT EMITTING ELEMENT DISPLAY DEVICE

CROSS-REFERENCE TO RELATED APPLICATION

The present application claims priority from Japanese application JP 2014-012823 filed on Jan. 27, 2014, the entire contents of which are hereby incorporated by reference into this application.

BACKGROUND OF THE INVENTION

1. Field of the Invention

The present invention relates to a light emitting element display device.

2. Description of the Related Art

In recent years, light emitting element display devices using self-luminous bodies such as organic light emitting diodes (OLED) have been put into practical use. As compared with the related art liquid crystal display device, because the light emitting element display devices including an organic EL (Electroluminescent) display device using the OLED use the self-luminous bodies, the light emitting element display device not only is excellent in visibility and response speed, but also requires no auxiliary lighting device such as backlight, and therefore can be further thinned.

JP 2002-352955A discloses a display device having the light emitting elements in which a drive element is formed below a bank, and a lower light shielding film having conductivity is formed below the drive element, to thereby prevent a leakage current, and form a bank layer by self-alignment.

In the organic EL display device, in recent years, high definition progresses, to thereby reduce the size of each pixel. The organic EL display device allows a current to flow by retaining a potential difference corresponding to a gradation value in each pixel. However, a reduction in the size of pixels causes electrodes to be also reduced in size, as a result of which a capacity for retaining the potential difference is reduced. If the capacity for retaining the potential difference is small, the potential difference changes due to an influence of noise or an influence of slight leakage, and brightness of the respective pixels is varied. As a result, it is conceivable that the display quality is degraded.

SUMMARY OF THE INVENTION

The present invention has been made in view of the above-mentioned circumstances, and therefore an object of the present invention is to provide an organic EL display device that is high in display quality even if high definition progresses.

According to the present invention, there is provided a light emitting element display device including light emitting elements that emit light by allowing a current to flow in a plurality of pixels arranged in a display area in a matrix, and at least two transistors that are arranged in each of the plurality of pixels, and control the current flowing in the light emitting elements, in which semiconductor portions of the at least two transistors are formed in layers different from each other. In the present specification, "layers different from each other" means layers not formed at the same time. Also, "pixel" means a unit having the light emitting element, and means a sub-pixel if the pixel is configured by plural light emitting elements to have plural sub-pixels.

Also, in the light emitting element display device according to the present invention, the at least two transistors may include a pixel transistor that controls the application of a voltage corresponding to a gradation value, and a drive transistor that controls light emission on the basis of a potential applied through the pixel transistor, a first layer having the semiconductor portion of the drive transistor may further include a first capacitor electrode made of a conductor, a second layer having the semiconductor portion of the pixel transistor may further include a second capacitor electrode that is continuous to the semiconductor portion of the pixel transistor, and made of a conductor forming a gate of the drive transistor, and the first capacitor electrode and the second capacitor electrode may overlap with each other through an insulating layer.

In the present specification, the first layer and the second layer may be formed of one layer formed at the same time, or may be formed of a set of plural layers including plural layers formed at the same time, for example, the combination of a layer of a semiconductor with a layer of source/drain. However, as described above, the semiconductor portions are required to be layers not formed at the same time.

Also, in the light emitting element display device according to the present invention, a third layer having scanning signal lines which are gates of the pixel transistors may further include a third capacitor electrode that is electrically independent from the scanning signal lines, electrically connected to the first capacitor electrode through a contact hole, and arranged to sandwich the second capacitor electrode in cooperation with the first capacitor electrode through an insulating layer.

Also, in the light emitting element display device according to the present invention, the first capacitor electrode may be electrically independent from the semiconductor portion of the drive transistor, and electrically connected to a reference potential.

Also, in the light emitting element display device according to the present invention, the first capacitor electrode may be continuous to the semiconductor portion of the drive transistor, and electrically connected to one of a source and a drain of the drive transistor made of a conductor.

Also, in the light emitting element display device according to the present invention, the second capacitor electrode and the third capacitor electrode may be formed to overlap with a reference potential line connected to a reference potential in a plan view.

Also, in the light emitting element display device according to the present invention, the first layer and the second layer may be made of polysilicon.

DETAILED DESCRIPTION OF THE INVENTION

Figure 1:
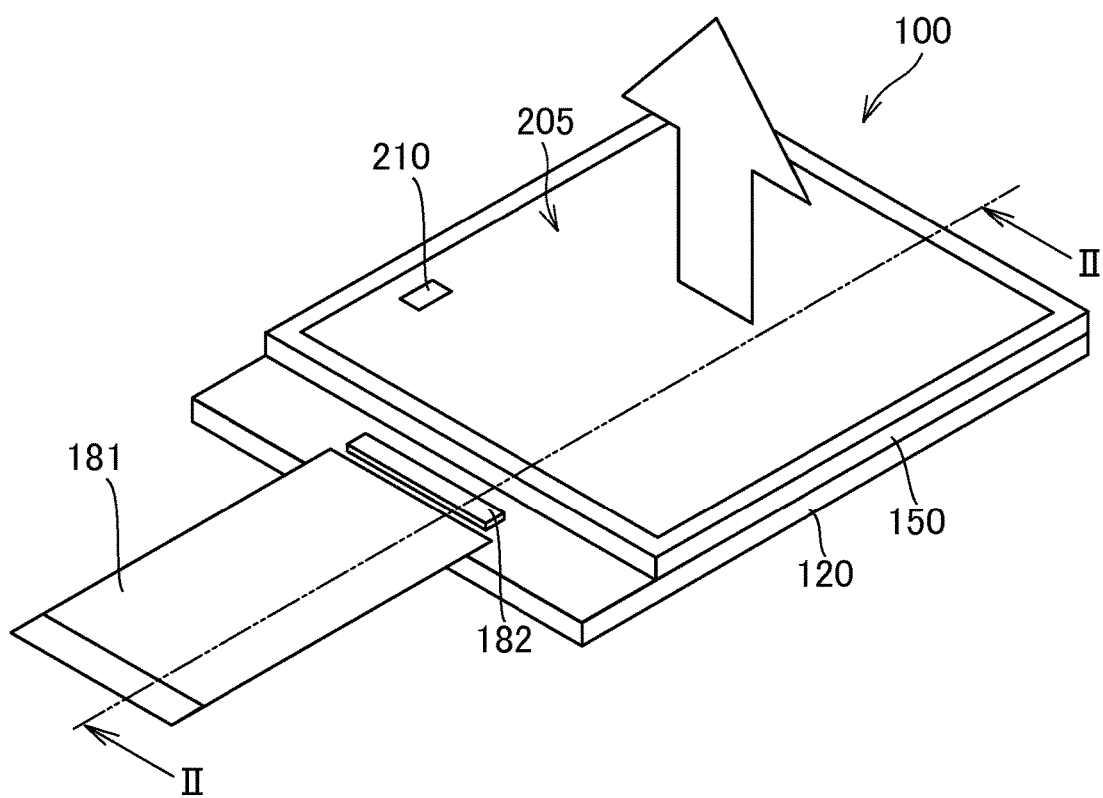
FIG. 1 is a diagram schematically illustrating an organic EL display device according to an embodiment of the present invention.

Hereinafter, the respective embodiments of the present invention will be described with reference to the accompanying drawings. The disclosure is merely exemplary, and appropriate changes that could be easily conceived by those skilled in the art without departing from the spirit of the present invention are naturally included within the scope of the present invention. Also, in the drawings, for more clarification of the illustration, as compared with actual embodiments, widths, thicknesses, and shapes of respective parts may be schematically illustrated, but may be merely exemplary, and do not limit the interpretation of the present invention. Also, in the present specification, and the respective drawings, the same elements as those described in the foregoing drawings are denoted by identical symbols, and their detailed description will be appropriately omitted.

FIG. 1 schematically illustrates an organic EL display device 100 that is a light emitting element display device according to an embodiment of the present invention. As illustrated in FIG. 1, the organic EL display device 100 has two substrates of a TFT (thin film transistor) substrate 120 and a counter substrate 150, and a filler 221 (refer to FIG. 2) made of transparent resin is sealed between those substrates. A display area 205 having pixels 210 arranged in a matrix is formed in the TFT substrate 120 and the counter substrate 150 of the organic EL display device 100. In this example, each of the pixels 210 is configured by plural sub-pixels 212 (to be described later).

Also, the TFT substrate 120 is formed of a substrate made of an insulating material of transparent glass or resin, and a drive IC (integrated circuit) 182 is mounted on the TFT substrate 120. The drive IC 182 is a drive circuit that applies a potential for conducting between a source and a drain to scanning signal lines 342 of pixel transistors 220 (to be described later) arranged in the respective sub-pixels 212, and also applies a voltage corresponding to a gradation value of the sub-pixels 212 to image signal lines 312 (to be described later). Also, an FPC (flexible printed circuits) 181 for inputting an image signal from the external is fitted to the TFT substrate 120. Also, in this embodiment, a top emission type organic EL display device that emits light to a side where a light emitting layer of the TFT substrate 120 is formed as indicated by an arrow in FIG. 1 is provided.

Figure 2:
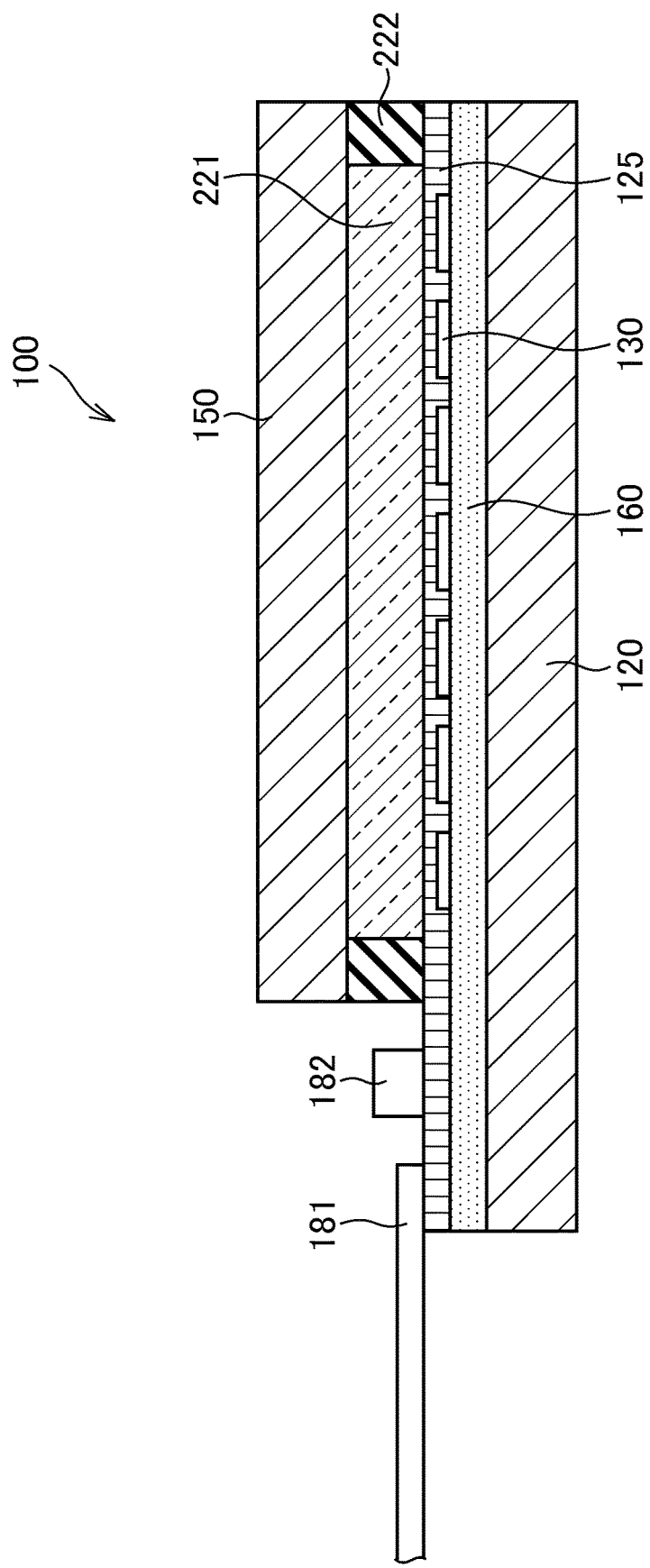
FIG. 2 is a schematic cross-sectional view taken along aline II-II of FIG. 1.

FIG. 2 is a schematic cross-sectional view taken along a line II-II of FIG. 1. As indicated in the cross-sectional view, a TFT circuit layer 160 in which TFT circuits are formed, plural organic EL elements 130 which are plural light emitting elements formed on the TFT circuit layer 160, and a sealing film 125 that covers the organic EL elements 130, and blocks moisture are formed over the TFT substrate 120. The organic EL elements 130 are formed by the number of sub-pixels 212 included in each of the pixels 210. However, for easily understanding the illustration, FIG. 2 is simplified. Also, color filters that transmit light of wavelength regions different from each other of, for example, three colors or four colors, and a black matrix which is a light shielding film that shields the light emitted from boundaries of the respective sub-pixels 212 are formed on the counter substrate 150. The filler 221 between the TFT substrate 120 and the counter substrate 150 is sealed with a sealant 222.

Figure 3:
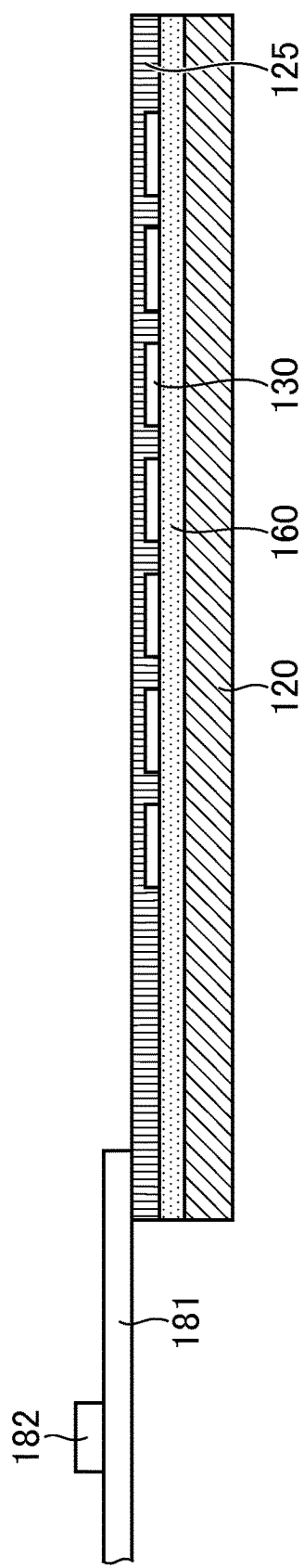
FIG. 3 is a diagram illustrating an example of an organic EL display device having no counter substrate.

In this embodiment, a configuration having the counter substrate 150 is provided as illustrated in FIG. 2. Alternatively, a configuration having no counter substrate 150 is provided as illustrated in FIG. 3. Also, as illustrated in FIG. 3, the drive IC 182 may be arranged on the FPC 181. In particular, if the TFT substrate 120 is made of a flexible resin material, the TFT substrate 120 may be integrated with the FPC 181. Also, in this embodiment, the organic EL elements 130 emit light of white, and transmit the light having the wavelength regions of three colors or four colors using a color filter. Alternatively, the organic EL elements 130 emit the light having the wavelength regions different from each other of, for example, three colors or four colors.

Figure 4:
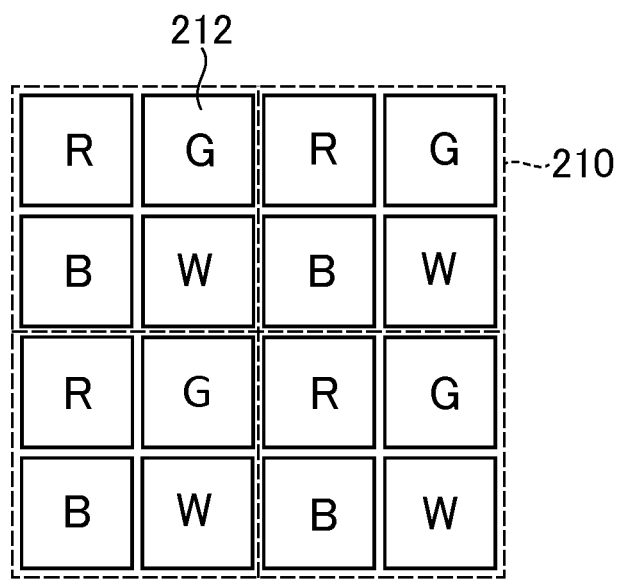
FIG. 4 is a diagram illustrating a configuration example of sub-pixels included in each of pixels in FIG. 1.
Figure 5:
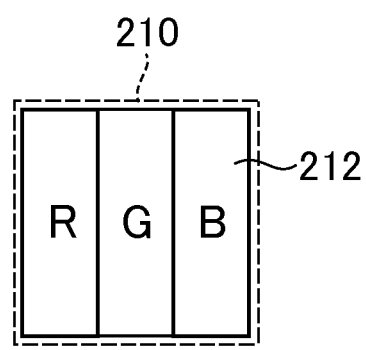
FIG. 5 is a diagram illustrating a configuration example of the sub-pixels included in each of the pixels in FIG. 1.

FIG. 4 is a diagram illustrating a configuration example of the sub-pixels 212 included in each of the pixels 210 in FIG. 1. As illustrated in FIG. 4, each of the pixels 210 includes substantially rectangular sub-pixels 212 that emit the light of the wavelength regions corresponding to four kinds of colors of R (red), G (green), B (blue), and W (white), and the sub-pixels 212 are aligned in squares in such a manner that two sides of each sub-pixel 212 come in contact with the other sub-pixels 212 within the same pixel 210. The configuration of the sub-pixels 212 in each of the pixels 210 is not limited to the configuration in FIG. 4, but may be a stripe configuration including the sub-pixels 212 corresponding to three colors of RGB as illustrated in FIG. 5, or a stripe configuration using four kinds of colors of RGBW. The arrangement of the sub-pixels 212 configuring the pixels 210 is not limited to those configurations, but may be appropriately determined.

Figure 6:
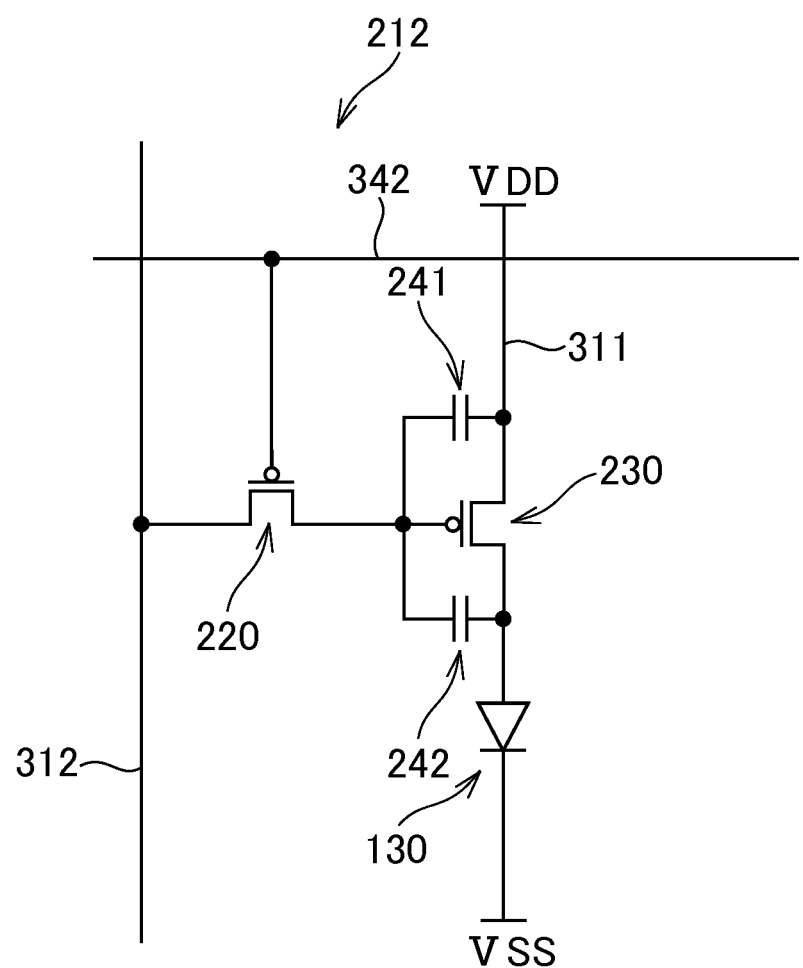
FIG. 6 is a circuit diagram illustrating an example of a circuit in each of the sub-pixels.

FIG. 6 is a circuit diagram illustrating an example of a circuit in each of the sub-pixels 212. The operation of the circuit for emitting light will be described with reference to FIG. 6. An image signal corresponding to a gradation value of each sub-pixel 212 is supplied to each of the image signal lines 312, and the pixel transistor 220 is rendered conductive on the basis of the signal of the scanning signal line 342, as a result of which a voltage based on the gradation value is stored in a capacitor 241 and/or 242. The organic EL elements 130 emit light by allowing a drive transistor 230 to flow a current based on the potential stored in the capacitor 241 and/or 242. A cathode side of the organic EL element 130 is connected to a low reference potential VSS, and a source side (side opposite to the organic EL elements 130 side) of the drive transistor 230 is connected to a high reference potential line 311 retained to a high reference potential VDD.

In this example, both of the respective capacitors 241 and 242 may be formed, or any one capacitor may be formed. In this circuit diagram, a p-type semiconductor is used, but an n-type semiconductor may be used. Also, the circuit of FIG. 6 is a simple circuit for describing the control of light emission, and has two transistors. Alternatively, the circuit may be configured to have three or more transistors, or may include the other control lines or capacitors. Thus, the configuration of the circuit can be arbitrarily determined.

Figure 7:
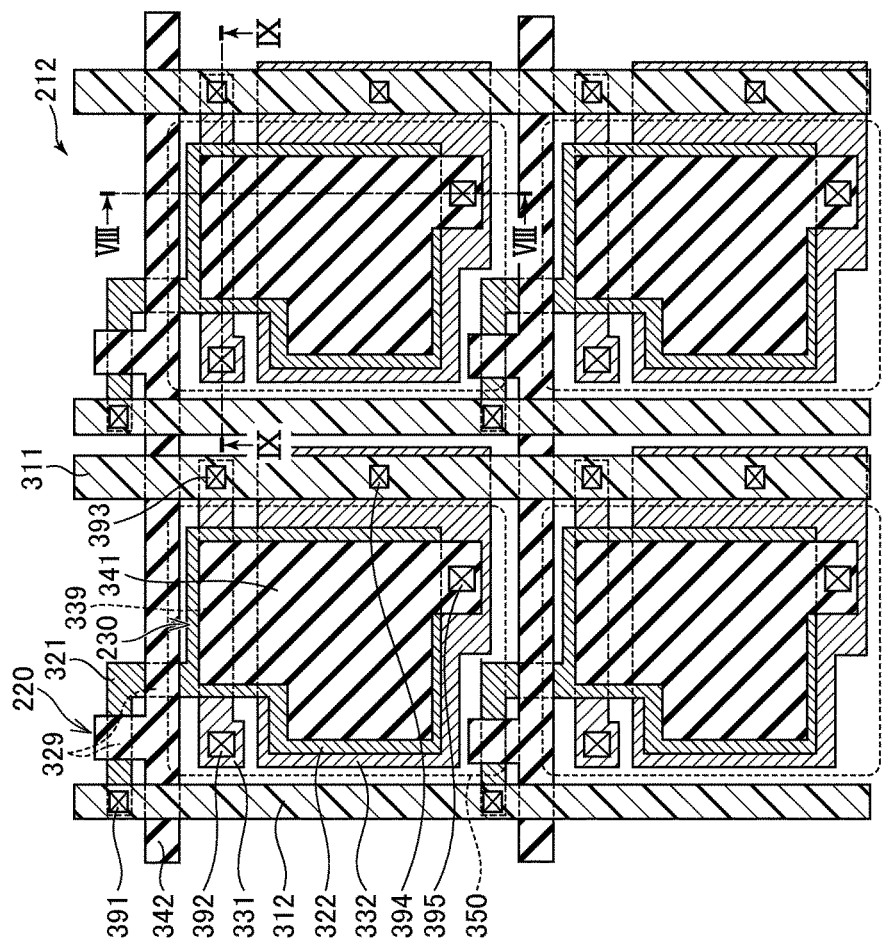
FIG. 7 is a diagram schematically illustrating a layout of lines and electrodes configuring the circuit of FIG. 6.

FIG. 7 is a diagram schematically illustrating a layout of the lines and the electrodes configuring the circuit of FIG. 6. FIG. 7 illustrates four sub-pixels 212, and the scanning signal line 342, the image signal line 312, and the high reference potential line 311 extend in each of the sub-pixels 212. In FIG. 7, for the purpose of describing the circuit of each sub-pixel 212, only a layer associated with a circuit lower than an anode electrode 350 is illustrated, and a layer structure associated with the light emission higher than the anode electrode 350 is omitted. Also, only a layout position of the anode electrode 350 is indicated by a dashed line.

As illustrated in FIG. 7, a first layer (331, 332) having a semiconductor portion 339 of the drive transistor 230 includes a drive transistor channel electrode 331 having the source and drain of the drive transistor 230 together with the semiconductor portion 339, and a first capacitor electrode 332 electrically independent from the drive transistor channel electrode 331, and made of an electric conductor. The drive transistor channel electrode 331 is connected to the anode electrode 350 through a contact hole 392, and also connected to the high reference potential line 311 through a contact hole 393. The first capacitor electrode 332 is connected to the high reference potential line 311 through a contact hole 394.

A second layer (321, 322) having a semiconductor portion 329 of the pixel transistor 220 includes a pixel transistor channel electrode 321 having the source and drain of the pixel transistor 220 together with the semiconductor portion 329 formed in a portion overlapping with the scanning signal line 342, and a second capacitor electrode 322 that is formed continuously to the pixel transistor channel electrode 321, and overlaps with the first capacitor electrode 332 in a plan view. The pixel transistor channel electrode 321 is connected to the image signal line 312 through a contact hole 391.

Figure 8:
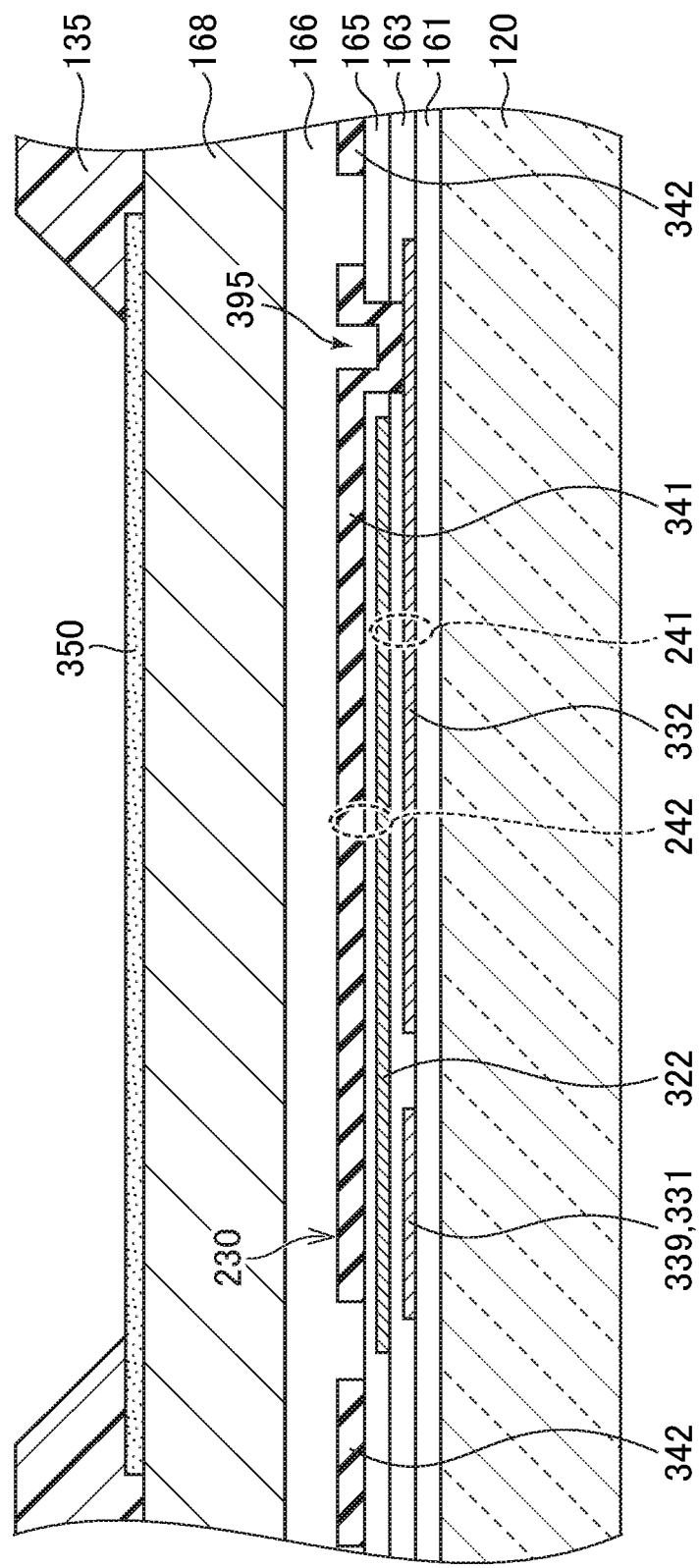
FIG. 8 is a schematic cross-sectional view taken along a line VIII-VIII of FIG. 7.
Figure 9:
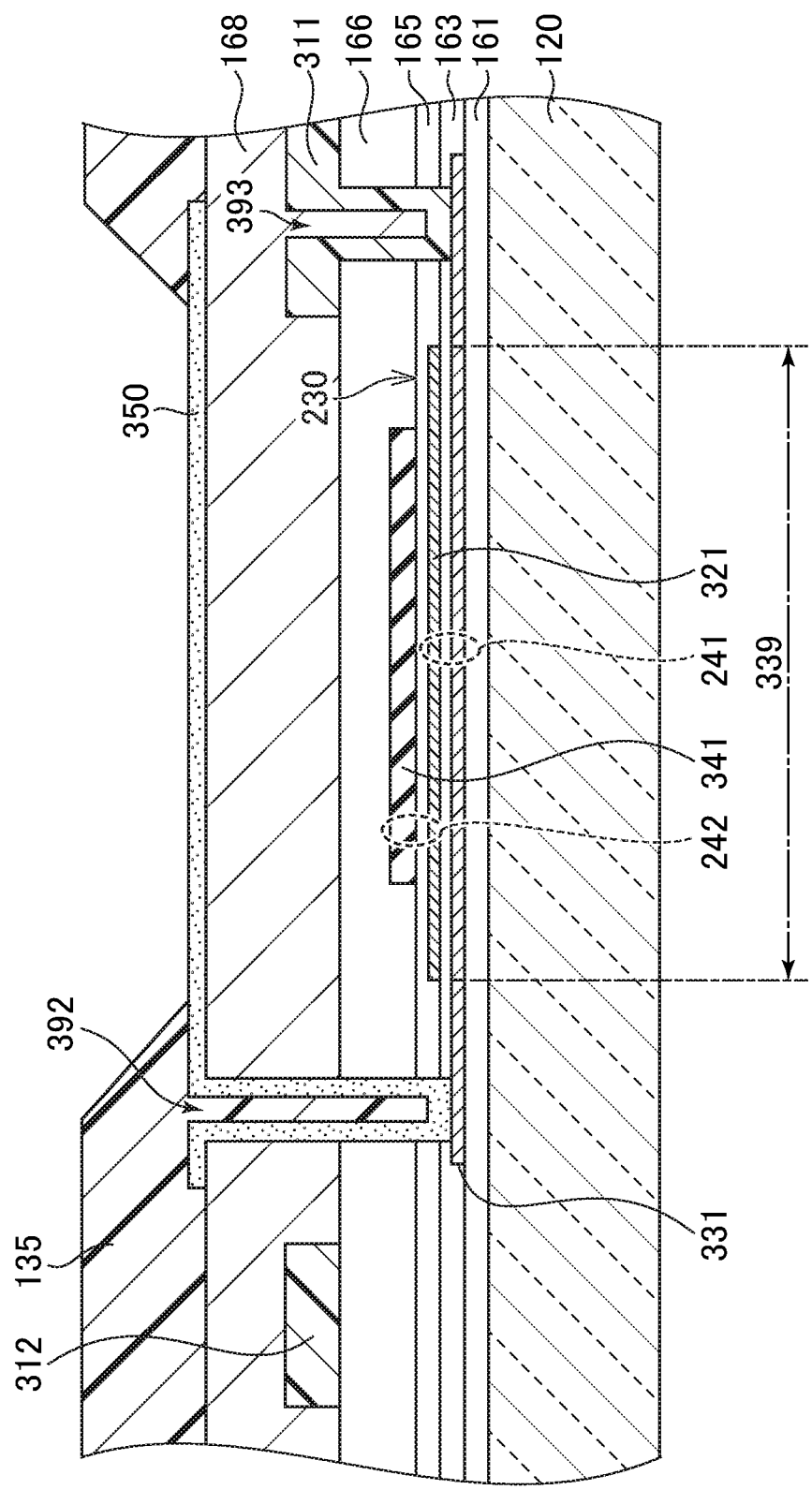
FIG. 9 is a schematic cross-section view taken along a line IX-IX of FIG. 7.

A third layer (341, 342) having the scanning signal line 342 includes a third capacitor electrode 341 that is electrically independent from the scanning signal line 342, electrically connected to the first capacitor electrode 332 through a contact hole 395, and arranged to sandwich the second capacitor electrode 322 in association with the first capacitor electrode 332 through insulating layers 163 and 165 (refer to FIGS. 8 and 9). The high reference potential line 311 and the image signal line 312 are formed over the third layer (341, 342) through an insulating layer 166.

In this embodiment, the first layer (331, 332) and the second layer (321, 322) are made of polysilicon, the amount of ion implantation is changed by the semiconductor portion 339, the semiconductor portion 329, and other portions to form a semiconductor portion and a conductor portion. Therefore, those "layers" in this embodiment are films formed in the same process at the same time. However, even if the source and drain and the semiconductor layer are formed in layers different from each other with the use of another semiconductor material such as amorphous semiconductor or an oxide film semiconductor, the "layer" of the first layer or the second layer is configured by a layer including the plural layers of the source and drain and the semiconductor layer whereby this embodiment can be applied to this configuration. Therefore, the first layer to the third layer may be each formed of a composite layer including the plural layers, and particularly the first layer and the second layer may be each formed of a composite layer including the semiconductor layer and the conductor layer of the source/drain.

Also, ends of the first layer (331, 332) and the second layer (321, 322) are formed at a distance from the semiconductor portion or the connection portion such as the contact holes, and the amount of ion implantation on the ends is reduced with the result that a so-called LDD (low doped drain) structure that reduces an electric field generated in the crystal grain boundary may be used. Also, the high reference potential line 311, the image signal lines 312, and the conductor portion of the third layer can be made of metal such as Al, Cu, Au, Ti, Mo, or W, or organic material having the conductivity such as doped polysilicon. Further, the high reference potential line 311 and the image signal lines 312 may be formed by lines having a Ti/Al/Ti structure in which Al is sandwiched between Ti.

FIG. 8 is a schematic cross-sectional view taken along aline VIII-VIII of FIG. 7. In FIG. 8, films upper than a pixel separation film 135 that is formed to cover an end of the anode electrode 350 with resin, and isolates between the anode electrodes 350 of the adjacent sub-pixels 212 are omitted. As illustrated in this cross-sectional view, the first layer (331, 332) is formed on a base film 161 made of an insulating material such as SiNx, and includes the drive transistor channel electrode 331 and the first capacitor electrode 332, and the first capacitor electrode 332 is connected to the third capacitor electrode 341 of the third layer (341, 342) through the contact hole 395 opened in the insulating layers 163 and 165. The second capacitor electrode 322 of the second layer (321, 322) is formed between the insulating layers 163 and 165 made of an insulating material such as SiNx, and the capacitor 241 in the circuit diagram of FIG. 6 is formed by the first capacitor electrode 332, the second capacitor electrode 322, and the third capacitor electrode 341.

FIG. 9 is a schematic cross-sectional view taken along aline IX-IX of FIG. 7. As illustrated in this cross-sectional view, the drive transistor channel electrode 331 is connected to the high reference potential line 311 formed in the same layer with the image signal line 312 on the insulating layer 166 through the contact hole 393, and also connected to the anode electrode 350 formed on a planarization film 168 made of resin such as acrylic or polyimide through the contact hole 392. An overlap portion of the drive transistor channel electrode 331 with the pixel transistor channel electrode 321 forms the semiconductor portion 339.

As described above, according to this embodiment, because the semiconductor portion 339 of the drive transistor 230 and the semiconductor portion 329 of the pixel transistor 220 are formed in the first layer (331, 332) and the second layer (321, 322), respectively, a larger capacitor electrode can be formed, the potential difference can be more stably retained, and display can be performed with higher quality. Also, because a space can be efficiently used in each of the sub-pixels 212, even if the higher definition progresses, the larger capacitor electrode can be provided, and display can be performed with high quality.

In the above embodiment, the structure having the third capacitor electrode 341 is provided. However, if a more sufficient capacitor can be formed by the first capacitor electrode 332 and the second capacitor electrode 322, the third capacitor electrode 341 may not be provided. Also, in the above-described embodiment, a case in which two transistors are present in each of the sub-pixels 212, and two semiconductor layers are provided has been described. Alternatively, three or more transistors may be provided, or three semiconductor layers may be provided.

Figure 10:
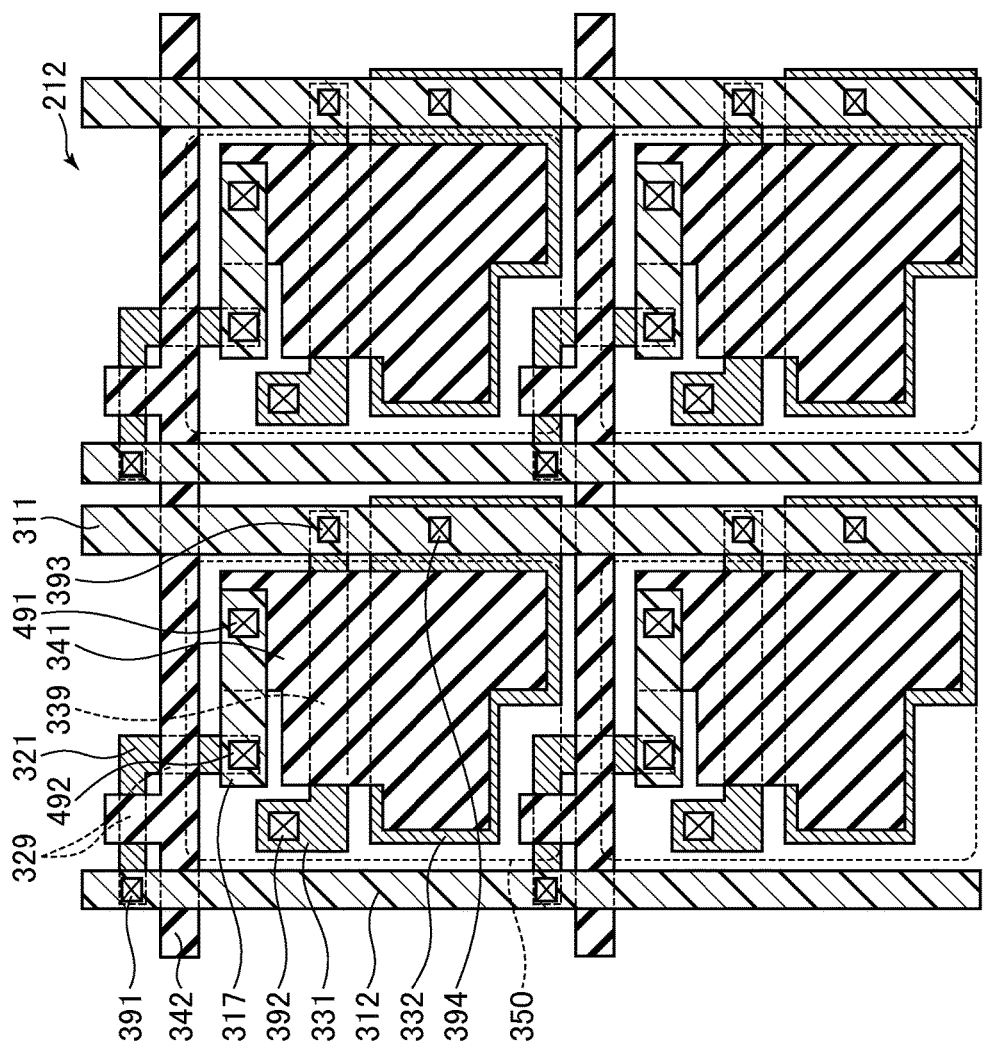
FIG. 10 is a diagram illustrating a comparative example of an embodiment.

FIG. 10 is a diagram illustrating a comparative example of the above embodiment. In a comparative example of FIG. 10, the semiconductor portion 339 of the drive transistor 230 and the semiconductor portion 329 of the pixel transistor 220 are formed in the same layer. When the semiconductor portions 339 and 329 are formed in the same layer in this way, a jumper wiring 317 and contact holes 491, 492 for connecting the pixel transistor channel electrode 321 and the third capacitor electrode 341 are required. Those components are required for improving the manufacture efficiency by performing a process of opening the contact holes at the same time, but cause the structure of the sub-pixels 212 to be complicated, and the yield of products to be deteriorated. Also, because the pixel transistor channel electrode 321 and the drive transistor channel electrode 331 are formed in the same layer, not only one capacitor electrode is formed in the same layer as those layers, but also the size of the capacitor electrode is reduced, resulting in a risk that the sufficient capacitor cannot be ensured.

However, according to the configuration of the above embodiment illustrated in FIG. 7, because the pixel transistor channel electrode 321 and the drive transistor channel electrode 331 are formed in the different layers, the capacitor electrodes can be provided in the respective layers, and the size of the capacitor electrodes in the respective layers can increase. Also, because the source or drain of the pixel transistor 220 forms the gate of another drive transistor, there is no need to provide the jumper wiring 317 of FIG. 10, and the wiring and the manufacturing process can be provided with high efficiency. Therefore, in a circuit within the sub-pixel 212, the more stable potential difference can be retained, the display can be performed with the higher quality, and the yield can be improved.

Figure 11:
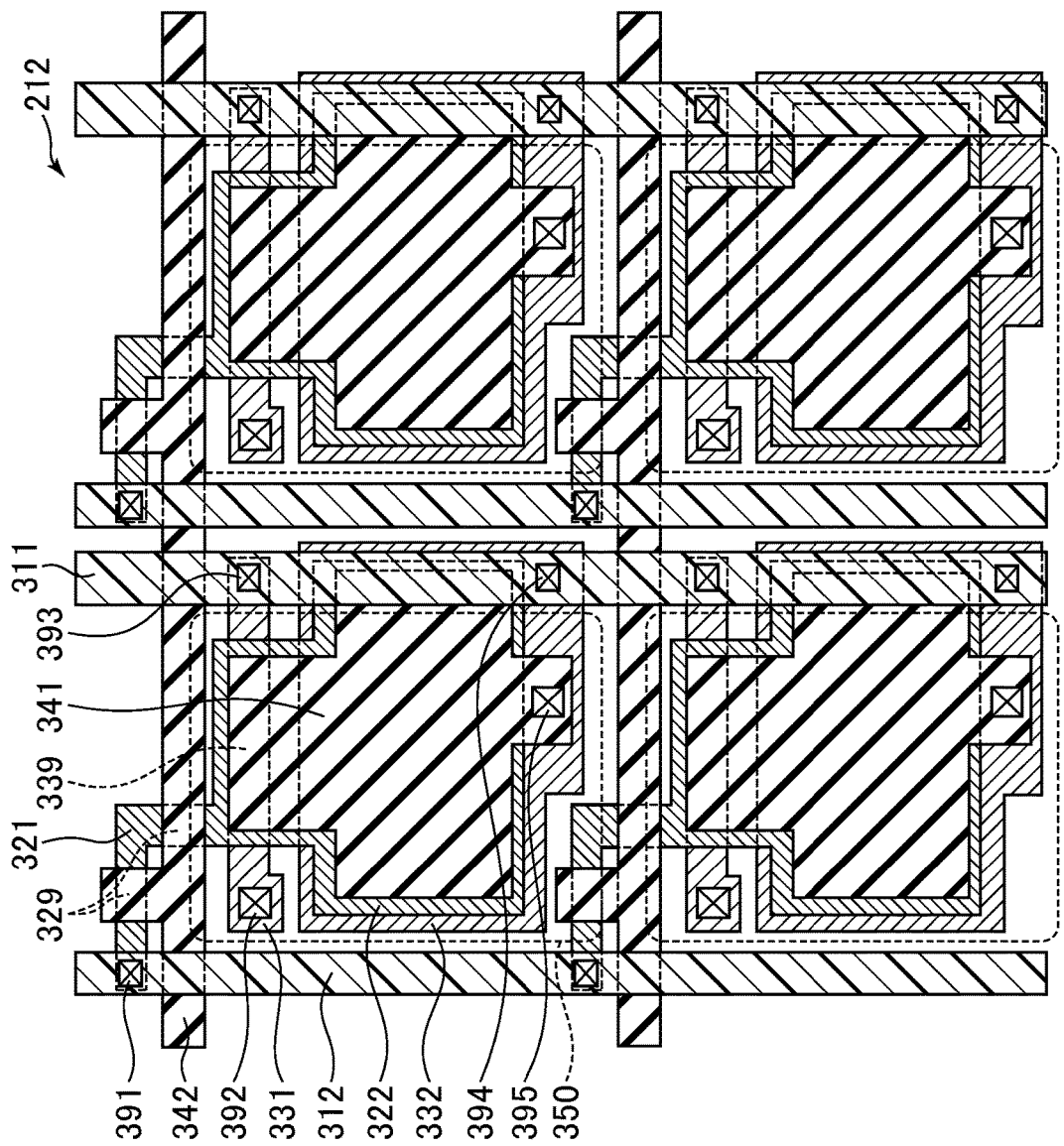
FIG. 11 is a diagram illustrating a first modification of this embodiment from the same view field as that in FIG. 7.

FIG. 11 is a diagram illustrating a first modification of the above embodiment from the same view field as that in FIG. 7. The first modification is different from the above embodiment in that the second capacitor electrode 322 and the third capacitor electrode 341 extend to a region overlapping with the high reference potential line 311, and the other configuration is identical with that of FIG. 7. With the provision of the second capacitor electrode 322 and the third capacitor electrode 341 which overlap with the high reference potential line 311 applied with the constant potential in this way, the potential retained by the second capacitor electrode 322 and the third capacitor electrode 341 can be more stabilized with the results that the display can be performed with the higher quality. Also, in the first modification, a configuration having no third capacitor electrode 341 can be provided, and in this case, with a configuration in which only the second capacitor electrode 322 overlaps with the high reference potential line 311, the potential can be stabilized, and the display can be performed with high quality.

Figure 12:
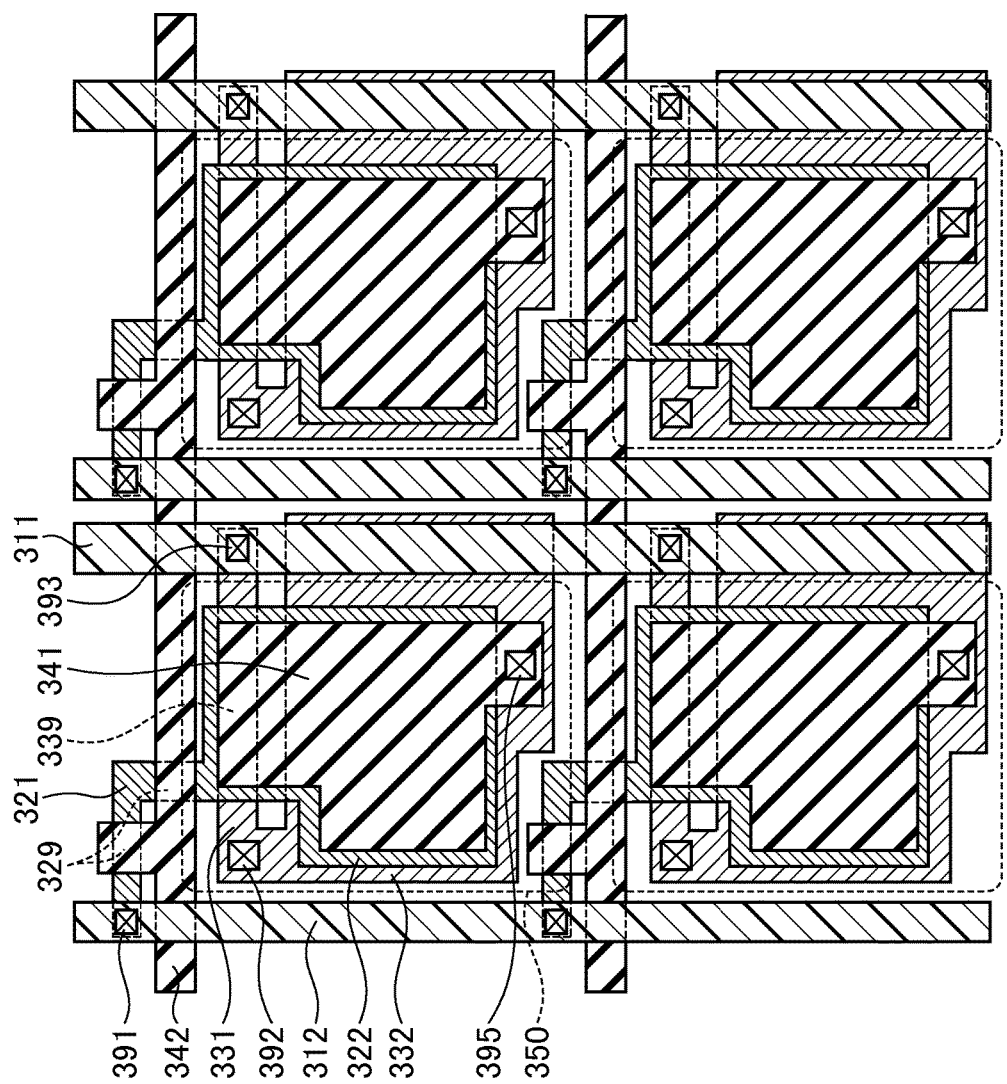
FIG. 12 is a diagram illustrating a second modification of this embodiment from the same view field as that in FIG. 7.

FIG. 12 is a diagram illustrating a second modification of the above embodiment from the same view field as that in FIG. 7. The second modification is different from the above embodiment in that the contact hole 394 is not provided, the first capacitor electrode 332 is not connected to the image signal line 312, and instead the first capacitor electrode 332 is connected to the organic EL element 130 side (drain side of the drive transistor 230 if the drive transistor 230 is formed of a p-type semiconductor) of the drive transistor channel electrode 331. With the above configuration, the first capacitor electrode 332, the second capacitor electrode 322, and the third capacitor electrode 341 form the capacitor 242 in the circuit diagram of FIG. 6. Even if the capacitor 242 is formed as a larger capacitor, the potential difference can be more stably retained, and the display can be performed with the higher quality. Therefore, the same advantages as those in the above embodiment can be obtained. Also, in the second modification of FIG. 12, as with the first modification of FIG. 11, the second capacitor electrode 322 and the third capacitor electrode 341 may be formed to overlap with the high reference potential line 311. In this case, the same advantages as those in the first modification can be obtained. Also, in the second modification, a configuration having no third capacitor electrode 341 can be provided. If the drive transistor 230 is made of an n-type semiconductor, the first capacitor electrode 332 is connected to the source side of the drive transistor 230.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate;
a first semiconductor layer on the substrate, the first semiconductor layer including a first channel region;
a second semiconductor layer for a first capacitor electrode on the substrate;
a first insulation layer on a top surface of the first semiconductor layer and the second semiconductor layer;
a third semiconductor layer on a top surface of the first insulation layer, the third semiconductor layer including a first portion for a first gate electrode, the third semiconductor layer including a second portion for a second capacitor electrode;
a second insulation layer on the third semiconductor layer;
an organic emitting element on the second insulation layer; and
a first electrode for a third capacitor electrode and a second electrode which lie between the second insulation layer and the organic emitting element,
wherein
the first channel region, the first insulation layer and the first gate electrode constitute a part of a first transistor,
the second semiconductor layer, the first insulation layer and the second portion of the third semiconductor layer constitute at least a part of a first capacitor,
the third semiconductor layer overlaps the first insulation layer, and the first and second semiconductor layers in a plan view,
the organic emitting element including an anode and an emitting layer, the emitting layer is above the anode and the emitting layer overlaps the first insulation layer, and the first, second, and third semiconductor layers in the plan view,
the second insulation layer lies between the third semiconductor layer and the organic emitting element,
the first electrode is electrically connected to the second semiconductor layer,
the second electrode includes a second gate electrode,
the third semiconductor layer includes a third portion for a second channel region,
the second portion of the third semiconductor layer, the second insulation layer, and the first electrode constitute at least a part of the first capacitor,
the second channel region, the second insulation layer, and the second gate electrode constitute a part of a second transistor, and
the organic emitting element overlaps the first electrode in the plan view.

2. The display device according to claim 1, wherein
the first electrode overlaps the first insulation layer and the first and second semiconductor layers in the plan view, and the second transistor has a portion arranged outside of the organic emitting element in the plan view.

3. A display device comprising:

a substrate;

a first semiconductor layer on the substrate, the first semiconductor layer including a first channel region;

a second semiconductor layer for a first capacitor electrode on the substrate;

a first insulation layer on the first semiconductor layer and the second semiconductor layer;

a third semiconductor layer on the first insulation layer, the third semiconductor layer including a first portion for a first gate electrode, the third semiconductor layer including a second portion for a second capacitor electrode;

a second insulation layer on the third semiconductor layer;

an organic emitting element on the second insulation layer;

a first electrode for a third capacitor electrode, the first electrode which lies between the second insulation layer and the organic emitting element;

a second electrode which lies between the second insulation layer and the organic emitting element;

a third insulation layer on the first and second electrodes; and a power voltage electrode on the third insulation layer, wherein the first channel region, the first insulation layer and the first gate electrode constitute a part of a first transistor, the second semiconductor layer, the first insulation layer and the second portion of the third semiconductor layer constitute at least a part of a first capacitor, the third semiconductor layer overlaps the first insulation layer and the first and second semiconductor layers in a plan view, the organic emitting element overlaps the first insulation layer and the first, second, and third semiconductor layers in the plan view, the second insulation layer lies between the third semiconductor layer and the organic emitting element, the first electrode is electrically connected to the second semiconductor layer, the second electrode includes a second gate electrode, the third semiconductor layer includes a third portion for a second channel region, the second portion of the third semiconductor layer, the second insulation layer, and the first electrode constitute at least a part of the first capacitor, the second channel region, the second insulation layer, and the second gate electrode constitute a part of a second transistor, the first electrode overlaps the first insulation layer and the first and second semiconductor layers in the plan view, the organic emitting element overlaps the first electrode in the plan view, the second transistor has a portion arranged outside of the organic emitting element in the plan view, the power voltage electrode overlaps a part of each of the second semiconductor layer, the third semiconductor layer and the first electrode, and the power voltage electrode is electrically connected to the first transistor in the plan view.

* * * * *